(12) United States Patent
Jeon et al.

(10) Patent No.: US 9,952,502 B2
(45) Date of Patent: Apr. 24, 2018

(54) PELLICLE FOR PREVENTING THERMAL ACCUMULATION AND EXTREME ULTRA-VIOLET LITHOGRAPHY APPARATUS HAVING THE SAME

(71) Applicants: Hwanchul Jeon, Seoul (KR); Munja Kim, Suwon-si (KR); Sungwon Kwon, Suwon-si (KR); Byunggook Kim, Seoul (KR); Roman Chalykh, Suwon-si (KR); Yongseok Jung, Seoul (KR); Jaehyuck Choi, Seoul (KR)

(72) Inventors: Hwanchul Jeon, Seoul (KR); Munja Kim, Suwon-si (KR); Sungwon Kwon, Suwon-si (KR); Byunggook Kim, Seoul (KR); Roman Chalykh, Suwon-si (KR); Yongseok Jung, Seoul (KR); Jaehyuck Choi, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 150 days.

(21) Appl. No.: 14/993,237

(22) Filed: Jan. 12, 2016

(65) Prior Publication Data

US 2016/0334698 A1    Nov. 17, 2016

(30) Foreign Application Priority Data

May 13, 2015   (KR) .......................... 10-2015-0066684

(51) Int. Cl.
*G03F 1/62* (2012.01)
*G03F 1/64* (2012.01)

(52) U.S. Cl.
CPC . *G03F 1/64* (2013.01); *G03F 1/62* (2013.01)

(58) Field of Classification Search
CPC ..................................... G03F 1/62; G03F 1/64
USPC .............................................................. 430/5
See application file for complete search history.

(56) References Cited

U.S. PATENT DOCUMENTS

| | | | |
|---|---|---|---|
| 7,666,555 B2 | 2/2010 | Goldstein et al. | |
| 7,767,985 B2 | 8/2010 | Okoroanyanwu et al. | |
| 8,018,578 B2 | 9/2011 | Banine et al. | |
| 2008/0152873 A1 | 6/2008 | Okoroanyanwu et al. | |
| 2009/0104544 A1 | 4/2009 | Kubota et al. | |
| 2013/0250260 A1 | 9/2013 | Singh | |
| 2014/0160455 A1 | 6/2014 | Yakunin et al. | |

FOREIGN PATENT DOCUMENTS

JP     2009-169380 A     7/2009

*Primary Examiner* — Christopher G Young
(74) *Attorney, Agent, or Firm* — Harness, Dickey & Pierce, P.L.C.

(57) ABSTRACT

A pellicle for lithography processes, including extreme ultraviolet (EUV) lithography may mitigate thermal accumulation in a membrane of the pellicle. The pellicle includes a membrane and at least one thermal buffer layer on at least one surface of the membrane. An emissivity of the thermal buffer layer may be greater than an emissivity of the membrane. A carbon content of the thermal buffer layer may be greater than a carbon content of the membrane. Multiple thermal buffer layers may be on separate surfaces of the membrane, and the thermal buffer layers may have different properties. A capping layer may be on at least one thermal buffer layer, and the capping layer may include a hydrogen resistant material. A thermal buffer layer may extend over some or all of a surface of the membrane. A thermal buffer layer may be between at least two membranes.

20 Claims, 16 Drawing Sheets

PELLICLE FOR PREVENTING THERMAL ACCUMULATION AND EXTREME ULTRA-VIOLET LITHOGRAPHY APPARATUS HAVING THE SAME

CROSS-REFERENCE TO RELATED APPLICATION

This application claims priority under 35 U.S.C. § 119 to Korean Patent Application No. 10-2015-0066684 filed on May 13, 2015, the disclosure of which is hereby incorporated by reference in its entirety.

BACKGROUND

Field

Embodiments of the inventive concepts relate in general to lithography apparatuses used in a lithography process, and in particular to a pellicle capable of preventing internal thermal accumulation generated by the high energy of light used in a lithography process, including an extreme ultra-violet (EUV) lithography process.

Description of Related Art

Devices, including semiconductor chip devices, may be at least partially manufactured via a process which includes lithography. For example, a pattern of material may be formed on a semiconductor chip wafer, as part of manufacturing a semiconductor chip device, via a lithography process. The lithography process may include applying a pattern of light on to a layer of photoresist material ("photoresist layer" on a wafer. The photoresist material upon which the applied light is incident may be modified by the light. The light is applied to the photoresist layer in a pattern, and a portion of the photoresist layer may be modified according to the pattern. As a result, upon application of the lithography process to a wafer that includes a photoresist layer, the wafer may include a layer of photoresist material that includes a pattern of modified photoresist material in the photoresist layer. The pattern of modified photoresist material may correspond to the pattern of the light applied to the photoresist layer in the lithography process. Subsequent to the lithography process, the modified photoresist material may be removed in a process which does not remove the unmodified photoresist material. In some cases, the unmodified photoresist material may be removed in a process which does not remove the modified photoresist material. As a result of removal of at least some of the photoresist material, the wafer may include a layer of photoresist material which extends in a pattern according to the pattern of light used in the lithography process.

In some cases, a lithography process includes an extreme ultraviolet (EUV) lithography process. An apparatus configured to implement an EUV lithography process to a device, also referred to herein as an Extreme ultra-violet (EUV) lithography apparatus, may include an EUV optical system applying EUV light to a wafer and a reticle in which an optical pattern is formed. As a result, EUV light applied to a surface of the water may include aerial image information corresponding to the optical pattern, and an aerial image corresponding to the optical pattern may thus be formed on the wafer.

In some cases, to protect the optical pattern of the reticle from external factors, the EUV lithography apparatus may include a pellicle. The pellicle may include a membrane covering the optical pattern of the reticle and a frame supporting the membrane. Light having high energy applied by the EUV optical system may pass through the membrane of the pellicle.

In some cases, the pellicle may incur damage. Such damage may result in a degrading of the EUV lithography apparatus in which the pellicle is included, thereby adversely affecting the EUV lithography process implemented by the apparatus.

SUMMARY

Some example embodiments provide a pellicle in which overall durability is improved, and an extreme ultra-violet (EUV) lithography apparatus including the same.

Some example embodiments provide a pellicle capable of preventing deformation of a membrane caused by light having high energy used in a lithography process, and an EUV lithography apparatus including the same.

Some example embodiments provide a pellicle capable of preventing thermal accumulation, and an EUV lithography apparatus including the same.

Some example embodiments provide a pellicle having high emissivity, and an EUV lithography apparatus including the same.

The technical objectives are not limited to the above disclosure. Other objectives may become apparent to those of ordinary skill in the art based on the following descriptions.

In accordance with some example embodiments, a pellicle includes a membrane, and a first thermal buffer layer on a first surface of the membrane, wherein the first thermal buffer layer is associated with a first emissivity, and the first emissivity is greater than an emissivity of the membrane.

In some example embodiments, the first thermal buffer layer may include carbon.

In some example embodiments, the first thermal buffer layer may include at least one of amorphous carbon, graphene, nanographite, a carbon nanosheet, a carbon nanotube, silicon carbide (SiC), or boron carbide (BC).

In some example embodiments, a vertical thickness of the first al buffer layer may be lower than a vertical thickness of the membrane.

In some example embodiments, the pellicle may further include a second thermal buffer layer on a second surface opposite to the first surface of the membrane, wherein the second thermal buffer layer is associated with a second emissivity, and the second emissivity is greater than the emissivity of the membrane.

In some example embodiments, the second thermal buffer layer may include carbon.

In some example embodiments, the second emissivity of the second thermal buffer layer may equal the first emissivity of the first thermal buffer layer.

In some example embodiments, the pellicle may include a frame on the second surface of the membrane, wherein the second thermal buffer layer extends between the membrane and the frame.

In accordance some example embodiments, a pellicle includes a membrane, a first thermal buffer layer disposed on a first surface of the membrane, and a first capping layer disposed on the first thermal buffer layer, wherein the first thermal buffer layer includes a first carbon content, and the first carbon content is greater than each of a carbon content of the membrane and a carbon content of the first capping layer.

In some example embodiments, a vertical thickness of the first capping layer may be lower than a vertical thickness of the first thermal buffer layer.

In some example embodiments, the pellicle may further include a second capping layer on a second surface opposite to the first surface of the membrane, wherein a carbon content of the second capping layer may be lower than the first carbon content of the first thermal buffer layer.

In some example embodiments, the pellicle may further include a frame on the second surface of the membrane, wherein the frame includes an inner side and an outer side, the inner side at least partially bounding an inner portion of the second surface of the membrane, the outer side facing an external environment, and the second capping layer may be on the inner portion of the second surface.

In some example embodiments, the pellicle may further include a second thermal buffer layer between the membrane and the second capping layer, wherein the second thermal buffer layer includes a second carbon content, and the second carbon content is greater than the carbon content of each of the membrane and the second capping layer.

In some example embodiments, the second carbon content of the second thermal buffer layer may equal the first carbon content of the first thermal buffer layer.

In some example embodiments, the first capping layer may include a hydrogen resistant material.

In accordance with some example embodiments, a pellicle includes a membrane, and a thermal buffer layer on a surface of the membrane, wherein the thermal buffer layer is configured to emit thermal radiation, and the thermal radiation emitted by the thermal buffer layer is associated with an intensity exceeding an intensity of thermal radiation emitted by the membrane.

In some example embodiments, the pellicle may further include a capping layer disposed on a surface of the thermal buffer layer, wherein the capping layer includes a lower amount of carbon than an amount of carbon included in the thermal buffer layer.

In some example embodiments, the pellicle may further include a frame disposed on the surface of the membrane, the frame including an inner side and an outer side, the inner side at least partially bounding an inner portion of the surface of the membrane, the outer side facing an external environment, wherein the thermal buffer layer is disposed on the inner portion of the second surface.

In some example embodiments, the thermal buffer layer may include a first thermal buffer layer on a first surface of the membrane and a second thermal buffer layer disposed on a second surface opposite to the first surface of the membrane, and the first and second thermal buffer layers are configured to emit different intensities of thermal radiation.

In some example embodiments, a vertical thickness of the second thermal buffer layer may be different than a vertical thickness of the first thermal buffer layer.

In some example embodiments, a pellicle includes a membrane and a thermal buffer on a surface of the membrane, where the thermal buffer layer includes a first carbon content, and the first carbon content is greater than a carbon content of the membrane.

In some example embodiments, a vertical thickness of the thermal buffer layer is different than a vertical thickness of the membrane.

In some example embodiments, the pellicle includes a capping layer, wherein the thermal buffer layer is between the membrane and the capping layer, and the first carbon content is greater than a carbon content of the capping layer.

In some example embodiments, the first thermal buffer layer is associated with a first emissivity, and the first emissivity is greater than an emissivity of the membrane.

In some example embodiments, the membrane includes a first membrane and a second membrane, the second membrane on the first membrane, the first thermal buffer layer is between the first membrane and the second membrane; and the first emissivity is greater than each of an emissivity of the first membrane and an emissivity of the second membrane.

BRIEF DESCRIPTION OF THE DRAWINGS

The foregoing and other features and advantages of the inventive concepts will be apparent from the more particular description of example embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1A:
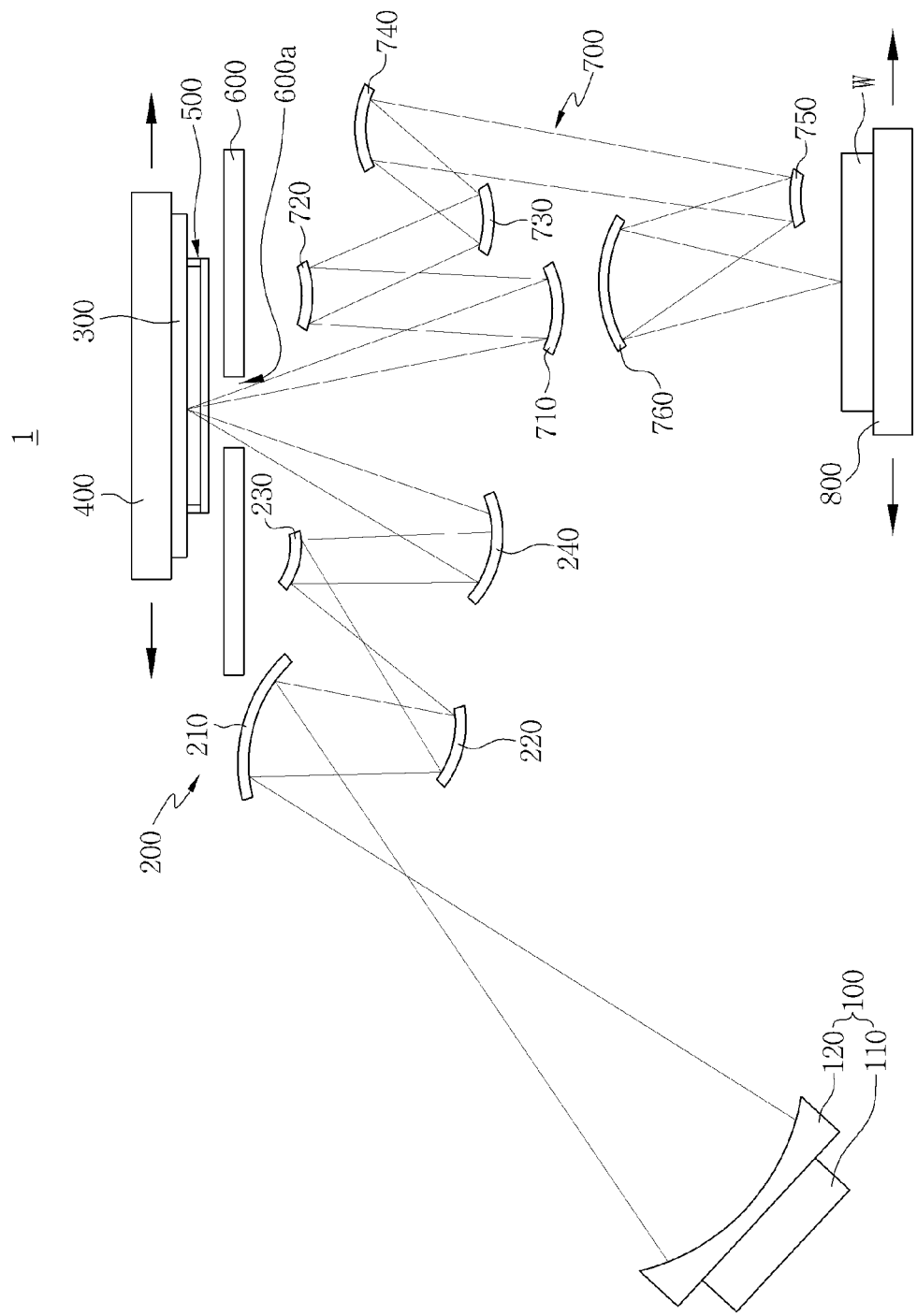
FIG. 1A is a schematic view illustrating an extreme ultra-violet (EUV) lithography apparatus including a pellicle according to some example embodiments of the inventive concepts.

One or more example embodiments will be described in detail with reference to the accompanying drawings. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

As used herein, the singular forms "a," "an," and "the," are intended to include the plural forms as well, unless the context clearly indicates otherwise. It will be further understood that the terms "comprises." "comprising," "includes," and/or "including," when used in this specification, specify the presence of stated features, integers, steps, operations, elements, and/or components, but do not preclude the presence or addition of one or more other features, integers, steps, operations, elements, components, and/or groups, thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

Unless otherwise defined, all terms (including technical and scientific terms) used herein have the same meaning as commonly understood by one of ordinary skill in the art to which example embodiments belong. Terms, such as those defined in commonly used dictionaries, should be interpreted as having a meaning that is consistent with their meaning in the context of the relevant art and/or this disclosure, and should not be interpreted in an idealized or overly formal sense unless expressly so defined herein.

Example embodiments may be described with reference to acts and symbolic representations of operations e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

Units and/or devices according to one or more example embodiments may be implemented using hardware, software, and/or a combination thereof. For example, hardware devices may be implemented using processing circuity such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, mod/or the like, capable being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a memory stick, a blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

Figure 1B:
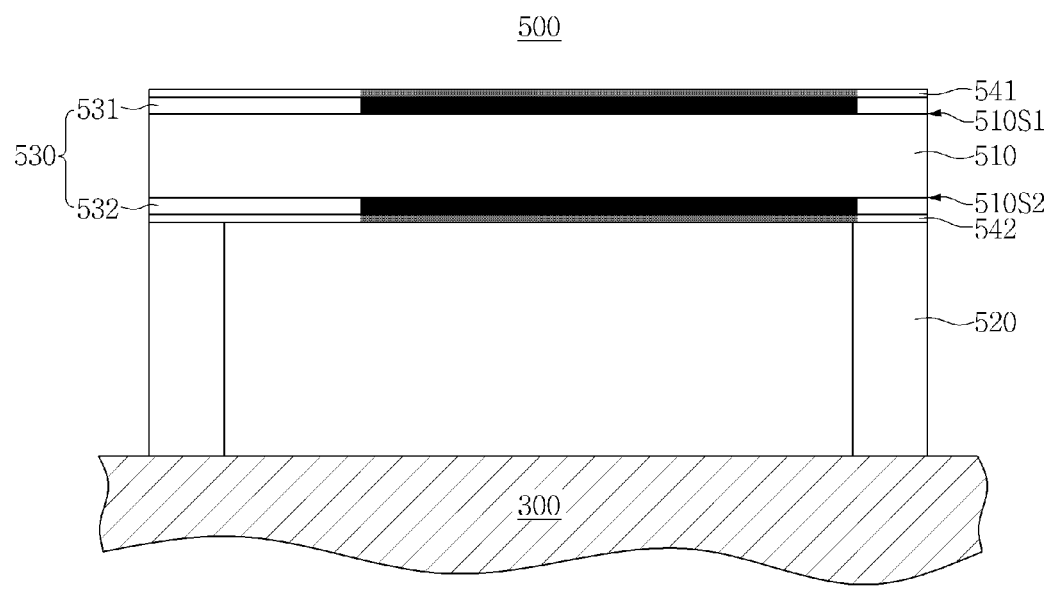
FIG. 1B is a view illustrating the pellicle according to some example embodiments of the inventive concepts.

FIG. 1A is a schematic view illustrating an extreme ultra-violet (EUV) lithography apparatus including a pellicle according to some example embodiments of the inventive concepts. FIG. 1B is a view illustrating the pellicle according to some example embodiments of the inventive concepts. The lithography apparatus 1, as shown in FIG. 1A, may implement a lithography process to form one or more patterns in a photoresist layer of a semiconductor wafer "W". The one or more patterns may include aerial images corresponding to optical patterns. The optical patterns may be provided in the reticle 300, as discussed further below.

Referring to FIGS. 1A and 1B, an EUV lithography apparatus 1 according to some example embodiments of the inventive concepts may include an EUV optical system 100, an illumination mirror system 200, a reticle 300, a reticle stage 400, a pellicle 500, a blinder 600, a projection mirror system 700, and a wafer stage 800.

The EUV optical system 100 may apply EUV light to the illumination mirror system 200. The EUV optical system 100 may include an EUV light source 110. The EUV light source 110 may generate EUV light. For example, the EUV light source 110 may generate light having a wavelength of approximately 13.5 nm.

The EUV optical system 100 may further include a light collector 120 interposed between the EUV light source 110 and the illumination mirror system 200. The light collector 120 may be configured to apply the EUV light generated by the EUV light source 110 toward the illumination mirror system 200. The light collector 120 may be configured to apply the EUV via one or more of reflection or refraction of at least a portion of the EUV light. For example, the EUV light generated by the light source 110 may be applied to the illumination mirror system 200 through the light collector 120. The light collector 120 may be located near the EUV light source 110.

The illumination mirror system 200 may apply the EUV light generated by the EUV optical system 100 to the reticle 300. In some example embodiments, the illumination mirror system 200 may generally and uniformly adjust the distribution of the intensity of the EUV light.

The illumination mirror system 200 may include a plurality of illumination mirrors 210 to 240. For example, the illumination mirror system 200 may include a first illumination mirror 210, a second illumination mirror 220, a third illumination mirror 230, and a fourth illumination mirror 240. Each of the illumination mirrors 210 to 240 may be a concave mirror or convex mirror.

The illumination mirror system 200 may prevent the loss of EUV light, reflected by the illumination mirrors 210 to 240, to the outside of an incident path. For example, the EUV light generated by the EUV optical system 100 may be condensed by the illumination mirror system 200.

The reticle 300 may reflect the EUV light applied to the reticle 300 by the illumination mirror system 200. For example, the EUV lithography apparatus 1 according to some example embodiments of the inventive concepts may be configured to perform a reflective lithography process.

The reticle 300 may include an optical pattern. For example, the optical pattern may be disposed on a surface of the reticle 300. The surface of the reticle 300 on which the optical pattern is disposed may face toward the illumination mirror system 200. The EUV light reflected by the reticle 300 may include aerial image information of the optical pattern, such that an aerial image of the optical pattern is formed on a photoresist layer of the wafer W.

The reticle 300 may be fixed on the reticle stage 400. For example, the reticle 300 may be fixed under the reticle stage 400. The reticle stage 400 may include an electrostatic chuck (ESC).

The reticle stage 400 may be configured to move in a lateral direction. The reticle 300 may be moved in a lateral direction by the reticle stage 400.

The pellicle 500 may be configured to prevent the optical pattern of the reticle 300 from being damaged by external factors. The pellicle 500 may be disposed on the surface of the reticle 300. The surface of the reticle 300 on which the pellicle 500 is disposed may face toward the illumination mirror system 200. For example, the optical pattern of the reticle 300 may be covered by the pellicle 500.

The pellicle 500 may include a membrane 510, a frame 520, a thermal buffer layer 530, a first capping layer 541, and a second capping layer 542. As shown, a thermal buffer layer 530 may include multiple thermal buffer layers, including a first thermal buffer layer 531 and a second thermal buffer layer 532.

The membrane 510 may be disposed on the optical pattern of the reticle 300. For example, the membrane 510 may be disposed on a surface of the reticle 300 to which EUV light is applied by the illumination mirror system 200. The EUV light applied from the illumination mirror system 200 may be applied to the reticle 300 through the membrane 510.

The membrane 510 may include a first surface 510S1 and a second surface 510S2. The first surface 510S1 of the membrane 510 may be disposed to face toward the illumination mirror system 200. The EUV light applied from the illumination mirror system 200 may be applied to the first surface 510S1 of the membrane 510, such that the EUV light applied from the illumination mirror system 200 is incident on the first surface 510S1. The second surface 510S2 of the membrane 510 may be opposite to the first surface 510S1 of the membrane 510. The second surface 510S2 of the membrane 510 may face the reticle 300.

The membrane 510 may include a material having high transmittance with respect to EUV light. For example, the membrane 510 may include a ceramic, such as silicon (Si), etc., or a metal such as zirconium (Zr), molybdenum (Mo), etc. The membrane 510 may have equal to or more than a desired (or, alternatively predetermined) physical strength to prevent the damage caused by an external impact and damage in a transferring/mounting process. For example, the membrane 510 may include a thickness of approximately 50 nm.

The frame 520 may support the membrane 510. The frame 520 may be disposed between the membrane 510 and the reticle 300. The membrane 510 may be spaced apart from the reticle 300 by the frame 520. The frame 520 may be disposed on an edge of the membrane 510.

The thermal buffer layer 530 may discharge heat generated at the membrane 510 to an external environment, relative to the pellicle 500. As referred to herein, the external environment may include an environment external to the pellicle 500, an environment external to the reticle 300, an environment external to some or all of the lithography apparatus 1, some combination thereof, etc. In the EUV lithography apparatus 1 according to some example embodiments of the inventive concepts, a lithography process may be performed in a vacuum state, such that the pellicle is located in a vacuum. Where the pellicle 500 is located in a vacuum, the thermal buffer layer 530 may be at least partially restricted to discharging heat generated at the membrane 510 via emitting radiation. The emissivity of the thermal buffer layer 530 may be greater than that of the membrane 510. The thermal buffer layer 530 may be referred to herein as being associated with the emissivity. The intensity of the thermal radiation emitted by the thermal buffer layer 530 may be greater than that the intensity of thermal radiation emitted by the membrane 510.

The thermal buffer layer 530 may include carbon. For example, the thermal buffer layer 530 may include at least one of amorphous carbon, graphene, nanographite, a carbon nanosheet, a carbon nanotube, silicon carbide (SiC), and boron carbide (BC). The amount of carbon included in the thermal buffer layer 530 may be greater than that included in the membrane 510. A carbon content of the thermal buffer layer 530 may be greater than a carbon content of the membrane 510. The thermal buffer layer 530 may be referred to as including the carbon content.

The thermal buffer layer 530 may include a first thermal buffer layer 531 and a second thermal buffer layer 532.

The first thermal buffer layer 531 may be disposed on the first surface 510S1 of the membrane 510. The first thermal buffer layer 531 may be in direct contact with the first surface 510S1 of the membrane 510. Sides of the first thermal buffer layer 531 may be vertically arranged with sides of the membrane 510. The first surface 510S1 of the membrane 510 may be fully covered by the first thermal buffer layer 531.

The second thermal buffer layer 532 may be disposed on the second surface 510S2 of the membrane 510. The second thermal buffer layer 532 may be in direct contact with the second surface 510S2 of the membrane 510. The second thermal buffer layer 532 may extend between the membrane 510 and the frame 520. Sides of the second thermal buffer layer 532 may be vertically arranged with the sides of the membrane 510. The second surface 510S2 of the membrane 510 may be fully covered by the second thermal buffer layer 532.

The emissivity of the second thermal buffer layer 532, also referred to herein as a second emissivity, may be the same as the emissivity of the first thermal buffer layer 531, also referred to herein as a first emissivity. As referred to herein, a layer property, including emissivity, which is the same as another layer property may be referred to as being "equal" to the other layer property. A property of a layer may include, without limitation, an emissivity of the layer, a carbon content of the layer, an amount of carbon included in the layer, and an intensity of radiation emitted by the layer. For example, the second emissivity of the second thermal buffer layer may be "equal" to the first emissivity of the first thermal buffer layer. The intensity of the thermal radiation emitted by the second thermal buffer layer 532 may be the same as the intensity of the thermal radiation emitted by the first thermal buffer layer 531. The second thermal buffer layer 532 may include a material which is common with a material included in the first thermal buffer layer 531.

Vertical thicknesses of the first thermal buffer layer 531 and the second thermal buffer layer 532 may be lower than a vertical thickness of the membrane 510. For example, the vertical thickness of the first thermal buffer layer 531 may be 2 nm or less. The vertical thickness of the second thermal buffer layer 5532 may be the same as the vertical thickness of the first thermal buffer layer 531. Vertical thickness may refer to a thickness which extends orthogonally relative to one or more of the surfaces 510S1 and 510S2.

In the EUV lithography apparatus 1 according to some example embodiments of the inventive concepts, a thermal buffer layer 530 may be disposed on a surface of the membrane 510. An emissivity of the thermal buffer layer 530 may be greater than the emissivity of the membrane 510. Accordingly, the EUV lithography apparatus 1 according to sonic example embodiments of the inventive concepts may prevent heat generated at the membrane 510 by the high energy of EUV light passing through the membrane 510 from accumulating in the membrane 510. The heat may be generated at the membrane 510 by the EUV light passing through the membrane 510. That is, in the EUV lithography apparatus 1 according to some example embodiments of the inventive concepts, deformation of the membrane 510 by thermal accumulation may be prevented based on prevention of heat accumulation in the membrane 510. Thus, in the EUV lithography apparatus 1 according to some example embodiments of the inventive concepts, the durability and lifetime of the pellicle 500 may be improved. Furthermore, in some example embodiments, preventing deformation of the membrane may prevent degradation of the lithography process implemented by the lithography apparatus 1. As a result, a consistent accuracy and precision of patterns formed on the wafers W may be maintained. Thus, a consistent quality of the devices at least partially manufactured via the lithography process implemented by lithography apparatus 1 may be maintained.

The first capping layer 541 may prevent the first thermal buffer layer 531 from being damaged by a lithography process or cleaning process. The first capping layer 541 may be disposed on the first thermal buffer layer 531. The first thermal buffer layer 531 may be interposed between the membrane 510 and the first capping layer 541. Sides of the first capping layer 541 may be vertically arranged with sides of the first thermal buffer layer 531.

The first capping layer 541 may include a hydrogen resistant material. For example, the first capping layer 541 may include at least one of silicon oxide (SiO), silicon nitride (SiN), silicon carbide (SiC), molybdenum (Mo), ruthenium (Ru), and zirconium (Zr). The first capping layer 541 may prevent the first thermal buffer layer 531 from being damaged by a lithography process or cleaning process, based on the first capping layer 541 including a hydrogen resistant material.

The emissivity of the first capping layer 541 may be lower than the first emissivity of the first thermal buffer layer 531. For example an amount of carbon included in the first capping layer 541 may be lower than the amount of carbon included in the first thermal buffer layer 531. As referred to herein, the amount of carbon included in the first thermal buffer layer 531 may be referred to as a first amount of carbon. A carbon content of the first thermal buffer layer 531 may be greater than a carbon content of one or more of the membrane 510 and the first capping layer 541. As referred to herein, the carbon content of the first thermal buffer layer 531 may be referred to as a first carbon content. A vertical thickness of the first capping layer 541 may be lower than that of the first thermal buffer layer 531.

The second capping layer 542 may prevent the second thermal buffer layer 532 from being damaged by a lithography process or cleaning process. The second capping layer 542 may be disposed on the second thermal buffer layer 532. The second thermal buffer layer 532 may be interposed between the membrane 510 and the second capping layer 542. The second capping layer 542 may extend between the frame 520 and the second thermal buffer layer 532. Sides of the second capping layer 542 may be vertically arranged with sides of the second thermal buffer layer 532.

The second capping layer 542 may include a hydrogen resistant material. For example, the second capping layer 542 may include at least one of silicon oxide SiO), silicon nitride (SiN), silicon carbide (SiC), molybdenum (Mo), ruthenium (Ru), and zirconium (Zr). The second capping layer 542 may include the same material as the first capping layer 541. The second capping layer 542 may prevent the second thermal buffer layer 532 from being damaged by a lithography process or cleaning process, based on the second capping layer 542 including a hydrogen resistant material.

The emissivity of the second capping layer 542 may be lower than an emissivity of the second thermal buffer layer 532. For example, an amount of carbon included in the second capping layer 542 may be lower than the amount of carbon included in the second thermal buffer layer 532. As referred to herein, the amount of carbon included in the second thermal buffer layer 532 may be referred to as a second amount of carbon. A carbon content of the second thermal buffer layer 532 may be greater than a carbon content of one or more of the membrane 510 and the second capping layer 542. As referred to herein, the carbon content of the second thermal buffer layer 532 may be referred to as a second carbon content.

The amount of carbon included in the second capping layer 542 may be the same as the amount of carbon included in the first capping layer 541. For example, the carbon content of the second capping layer 542 may be lower than the carbon content of the first thermal buffer layer 531.

A vertical thickness of the second capping layer 542 may the lower than the vertical thickness of the second thermal buffer layer 532. For example, the vertical thickness of the second capping layer 542 may be the same as the vertical thickness of the first capping layer 541. The vertical thickness of the second capping layer 542 may be lower than the vertical thickness of the first thermal buffer layer 531.

The blinder 600 may be disposed on the pellicle 500. For example, the blinder 600 may be disposed under the pellicle 500. The blinder 600 may include an aperture 600a. EUV light applied by the illumination mirror system 200 may pass through the aperture 600a of the blinder 600 and be applied to the reticle 300.

The aperture 600a of the blinder 600 may have various shapes. For example, EUV light applied to the reticle 300 by the contrast mirror system 200 may be formed in various shapes by the aperture 600a of the blinder 600.

The projection mirror system 700 may apply the EUV light reflected by the reticle 300 onto a wafer W seated on the wafer stage 800. The EUV light reflected by the reticle 300 may pass through the aperture 600a of the blinder 600 and be applied to the projection mirror system 700.

The projection mirror system 700 may correct the EUV light reflected by the reticle 300. For example, the projection mirror system 700 may correct the aberration of the EUV light reflected by the reticle 300.

The projection mirror system 700 may include a plurality of projection mirrors 710 to 760. For example, the projection mirror system 700 may include a first projection mirror 710, a second projection mirror 720, a third projection mirror 730, a fourth projection mirror 740, a fifth projection mirror 750, and a sixth projection mirror 760. The projection mirrors 710 to 760 may each be a concave mirror or convex mirror.

The wafer W may be fixed on the wafer stage 800. The wafer stage 800 may move in a lateral direction. The wafer W may be moved in a lateral direction by the wafer stage 800.

The movement of the wafer stage 800 may be related to the movement of the reticle stage 400. For example, the wafer stage 800 may move in a common direction as the movement of the reticle stage 400. A movement distance of the wafer stage 800 may be proportional to a movement distance of the reticle stage 400.

EUV light applied by the projection mirror system 700 may be focused on the wafer W. For example, the EUV light applied by projection mirror system 700 may be focused on a photoresist pattern formed on a surface of the wafer W. The wafer W may include a semiconductor chip wafer. The lithography process implemented with regard to wafer W may be included in a process of manufacturing a semiconductor chip device using the wafer W. The light applied to the wafer W may include aerial image information from the optical pattern included in the reticle 300. Applying the light to a surface of the wafer W may form a photoresist pattern on the wafer W, where the photoresist pattern is based on the optical pattern included in the reticle 300. The photoresist pattern may include portions of the wafer W surface being modified by the applied light. The forming of the photoresist pattern on the wafer W may be included in a process of manufacturing a semiconductor chip device. For example, the portion of the wafer W on which the photoresist pattern is formed may be removed via another process. A remaining portion of the photoresist on the wafer W may include a portion of wafer W material that is patterned according to the optical pattern.

Figure 2:
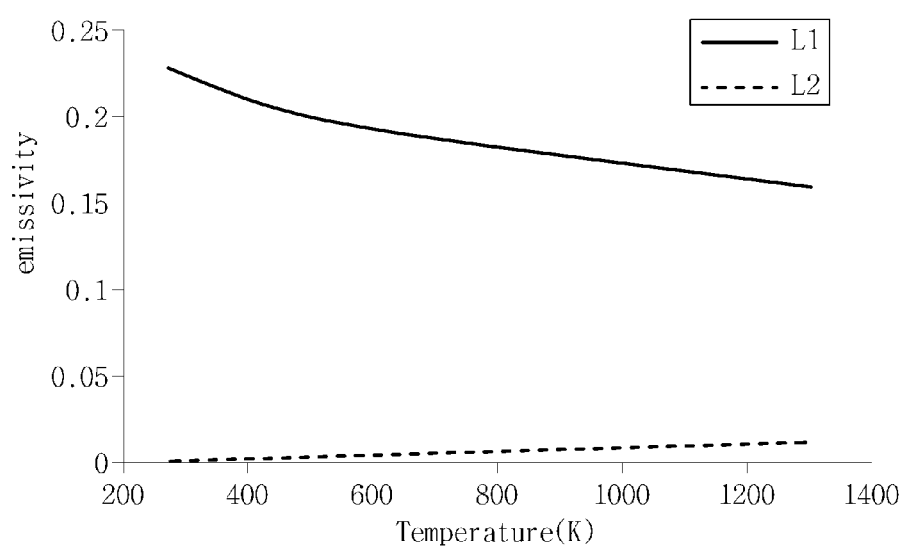
FIG. 2 is a graph showing emissivity differences of pellicles by a thermal buffer layer.

FIG. 2 is a graph showing the emissivity of a first pellicle L1 having a thermal buffer layer and the emissivity of a second pellicle L2 not having a thermal buffer layer based on a temperature. Here, the first pellicle L1 and the second pellicle L2 may include a membrane including silicon having a thickness of approximately 50 nm. The first pellicle L1 may include one or more thermal buffer layers. Each thermal buffer layer may include graphene having a thickness of approximately 2 nm. The thermal buffer layers may be disposed on both surfaces of the membrane.

Referring to FIG. 2, in a temperature of 400K to 1200K, the emissivity of the first pellicle L1 is greater than the emissivity of the second pellicle L2, The greater emissivity of the first pellicle L1 indicates that the first pellicle L1 may prevent thermal accumulation generated by EUV light having high energy used in a lithography process based on the thermal buffer layers included in the first pellicle. Thus, the thermal buffer layers of the first pellicle L1 may prevent deformation of the membrane of the first pellicle L1, where such deformation may be caused by the thermal accumulation. Accordingly, the durability of the first pellicle L1 may be higher than the durability of the second pellicle L2. Further, the lifetime of the first pellicle L1 can be greater than the lifetime of the second pellicle L2.

As a result, the pellicle and the EUV lithography apparatus including the same according to some example embodiments of the inventive concepts may prevent deformation of the membrane of the pellicle, where such deformation is caused by the thermal accumulation. Thus, the durability and lifetime of a pellicle according to some example embodiments of the inventive concepts may be improved. In addition, the process reliability of the EUV lithography apparatus including the pellicle according to some example embodiments of the inventive concepts may be improved.

Figure 3:
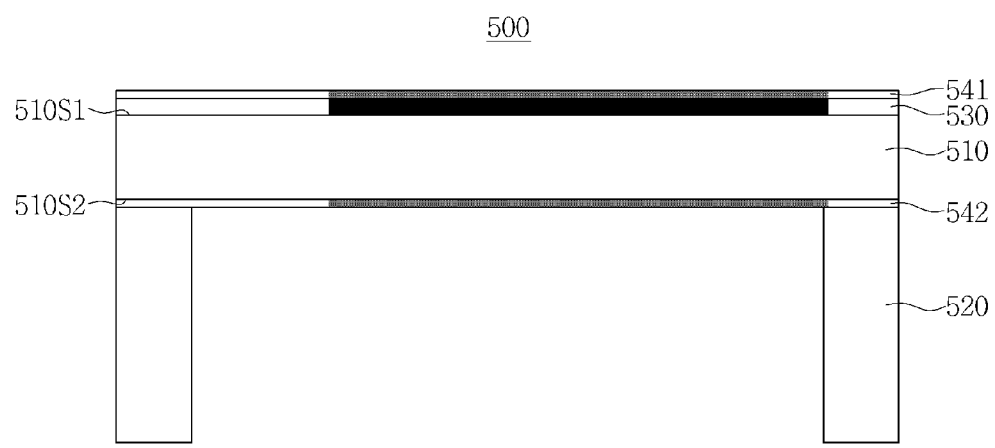
FIGS. 3, 4, 5, 6, 7, 8, 9, 10, 11, 12, 13, 14, 15, 16, 17, and 18 are views illustrating pellicles according to some example embodiments of the inventive concepts.
Figure 4:
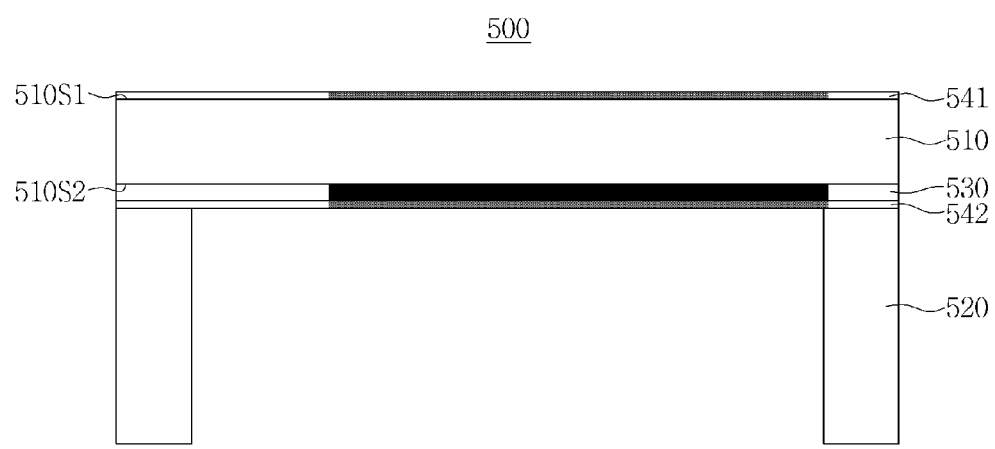

In the pellicle 500 according to some example embodiments of the inventive concepts, the thermal buffer layers 530 are disposed on both surfaces of the membrane 510. However, in the pellicle 500 according to some example embodiments of the inventive concepts, the thermal buffer layer 530 may include a thermal buffer layer 530 which is restricted to being disposed on the first surface 510S1 of the membrane 510 as shown in FIG. 3, or the thermal buffer layer 530 may include a thermal buffer layer 530 which is restricted to being disposed on the second surface 510S2 of the membrane 510 as shown in FIG. 4.

Figure 5:
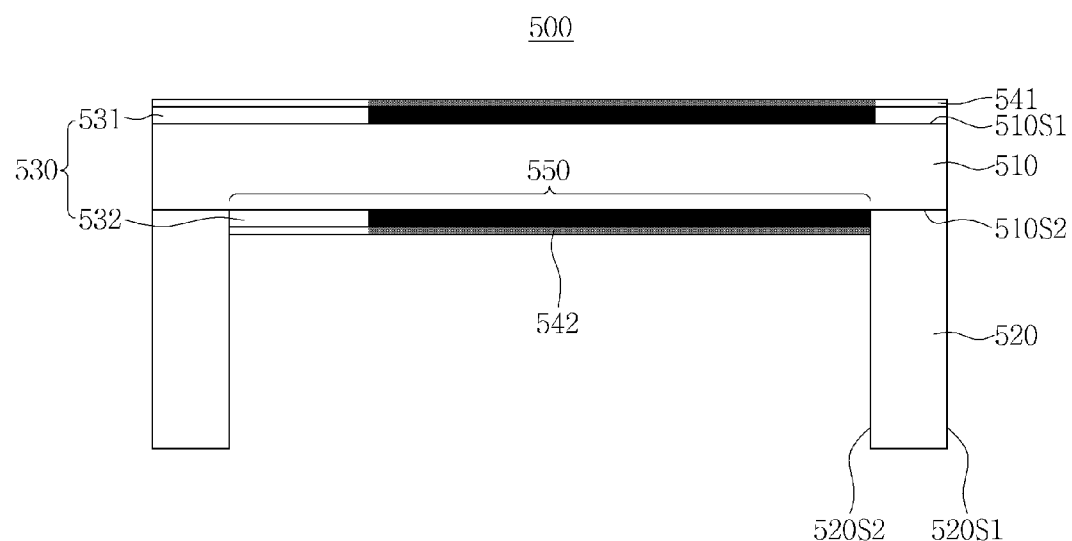

In the pellicle 500 according to some example embodiments of the inventive concepts, the second thermal buffer layer 532 and the second capping layer 542 extend between the membrane 510 and the frame 520. However, in the pellicle 500 according to some example embodiments of the inventive concepts, the second thermal buffer layer 532 and the second capping layer 542 may be disposed on an inner side of the frame 520 as shown in FIG. 5, such that the frame 520 is in direct contact with the second surface 510S2 of membrane 510 and one or more sides of the second thermal buffer layer 532 and the second capping layer 542 are bounded by the frame 520. As shown in FIG. 5, the frame 520 at least partially bounds an inner portion 550 of the second surface 510S2 of the membrane. The frame 520 includes an outer side 520S1 which faces towards an external environment. The frame 520 also includes an inner side 520S1 which faces towards the inner portion 550 of the second surface 510S2 of the membrane 510. The external environment is an environment external to the pellicle. As shown in FIG. 5, the second thermal buffer layer 532 and the second capping layer 542 may be disposed on the inner portion 550 of the second surface 510S2 of the membrane 510.

Figure 6:
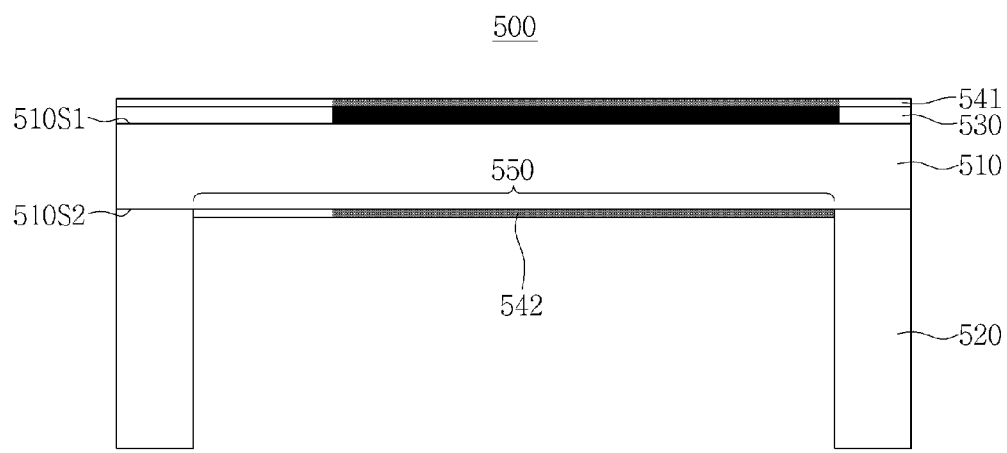
Figure 7:
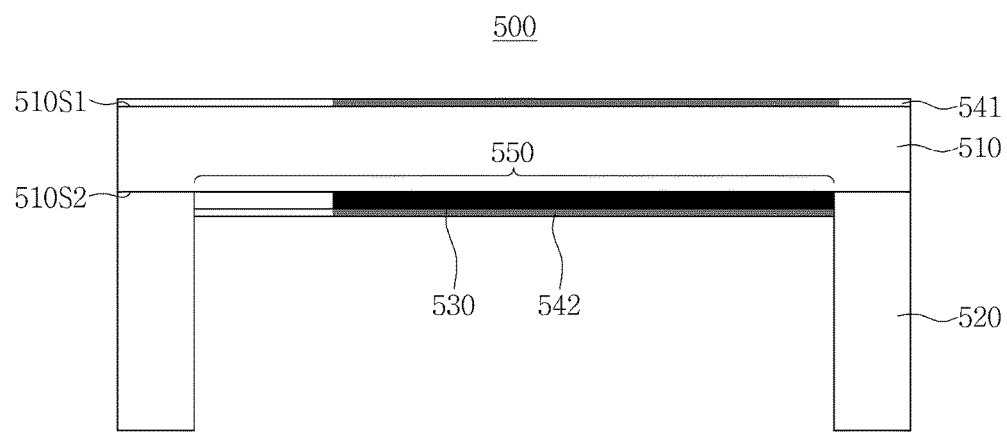

Further, in the pellicle 500 according to some example embodiments of the inventive concepts, the second capping layer 542 may be in direct contact with the second surface 510S2 of the membrane 510 and the thermal buffer layer 530 may be disposed on one of the surfaces 510S1, 510S2 of the membrane 510. For example, as shown in FIG. 6, the thermal buffer layer 530 may be disposed between the first capping layer 541 and the membrane 510. As shown in FIG. 6, the second capping layer 542 may be disposed on the inner portion 550 of the second surface 510S2 of the membrane 510. In another example, as shown in FIG. 7, the thermal buffer layer 530 may be restricted to being disposed between the second capping layer 542 disposed on the inner side of the frame 520 and the membrane 510. As shown in FIG. 7, the second thermal buffer layer 532 and the second capping layer 542 may be disposed on the inner portion 550 of the second surface 510S2 of the membrane 510.

Figure 8:
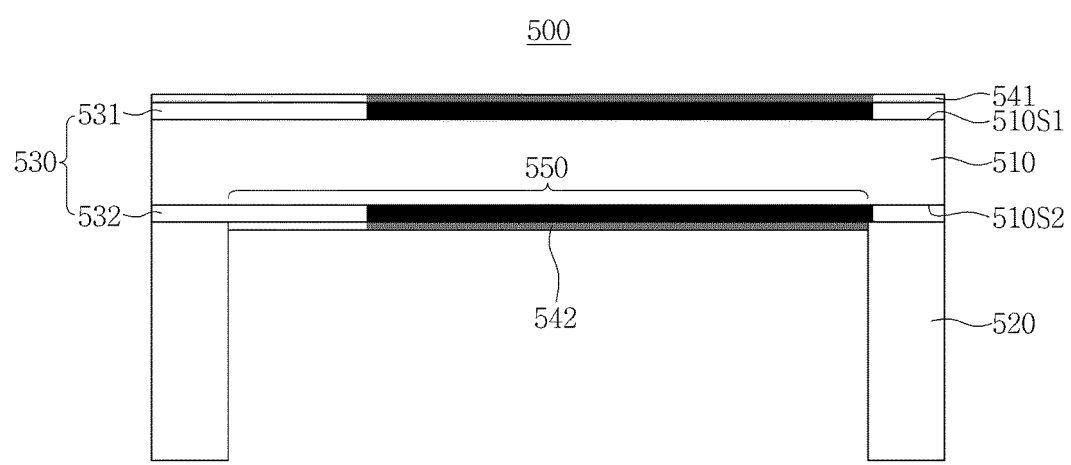

In the pellicle 500 according to some example embodiments of the inventive concepts, the sides of the second thermal buffer layer 532 are vertically arranged with the sides of the second capping layer 542. However, in the pellicle 500 according to some example embodiments of the inventive concepts, the second thermal buffer layer 532 may extend between the membrane 510 and the frame 520, and the second capping layer 542 may be disposed on the inner side of the frame 520 as shown in FIG. 8. As shown in FIG. 8, the second thermal buffer layer 532 may be disposed on an entirety of the second surface 510S2 of the membrane 510, and the second capping layer 542 may be disposed on the inner portion 550 of the second surface 510S2 of the membrane 510.

Figure 9:
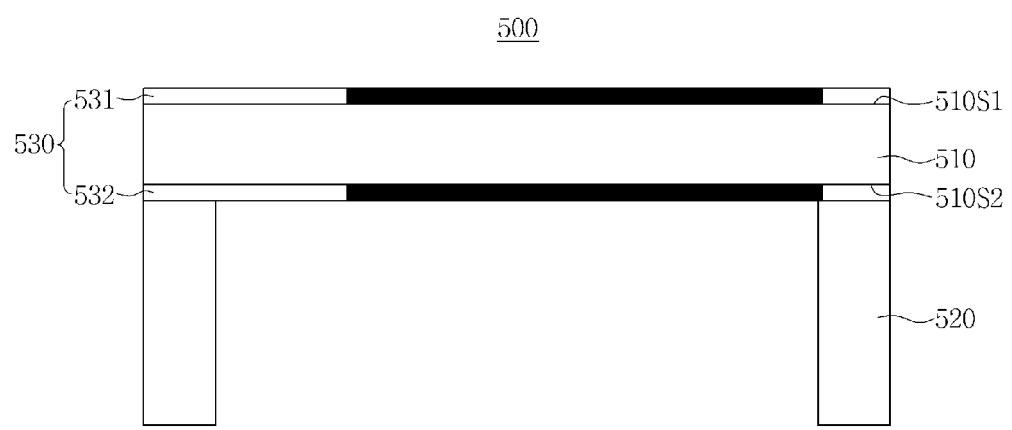
Figure 10:
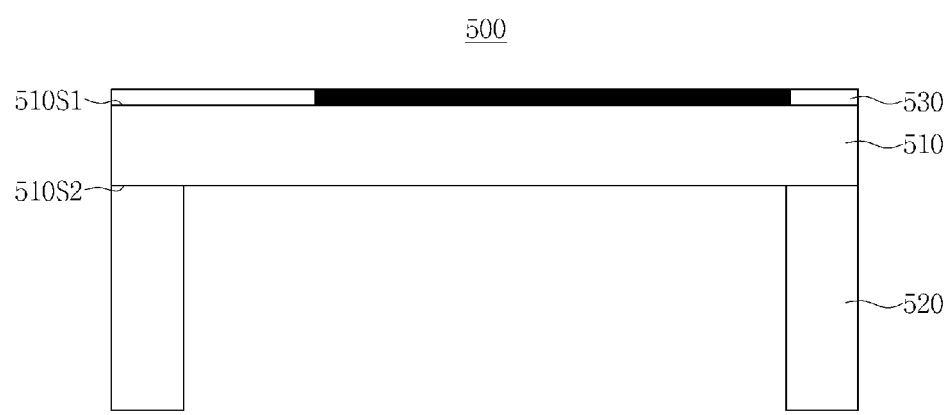
Figure 11:
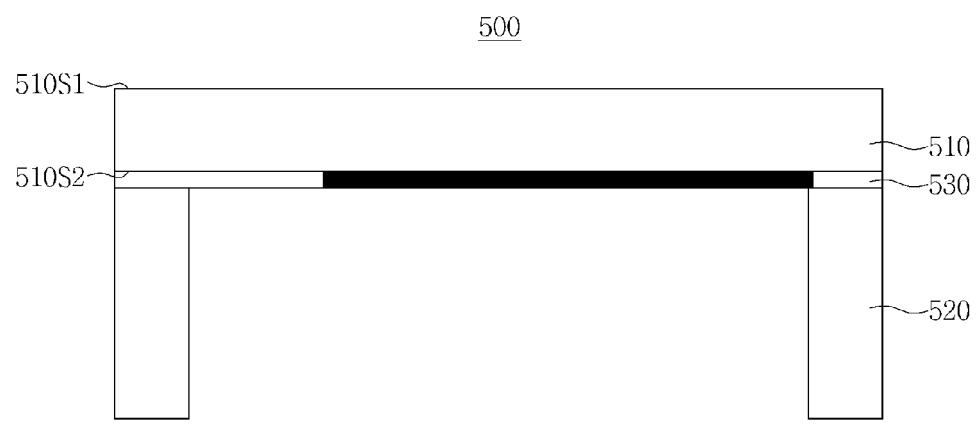
Figure 12:
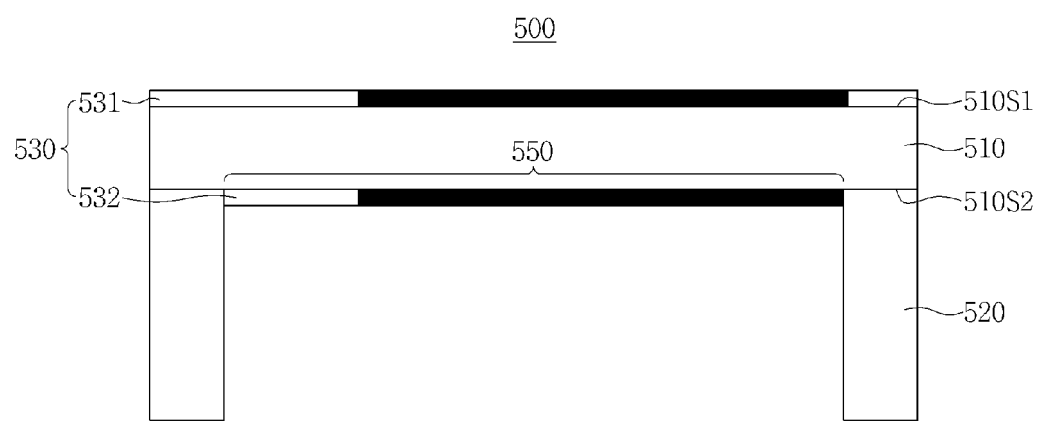
Figure 13:
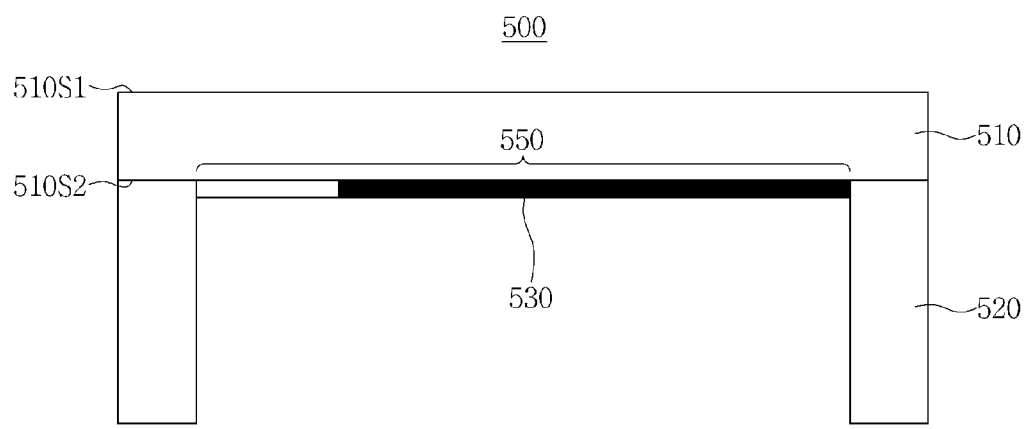
Figure 14:
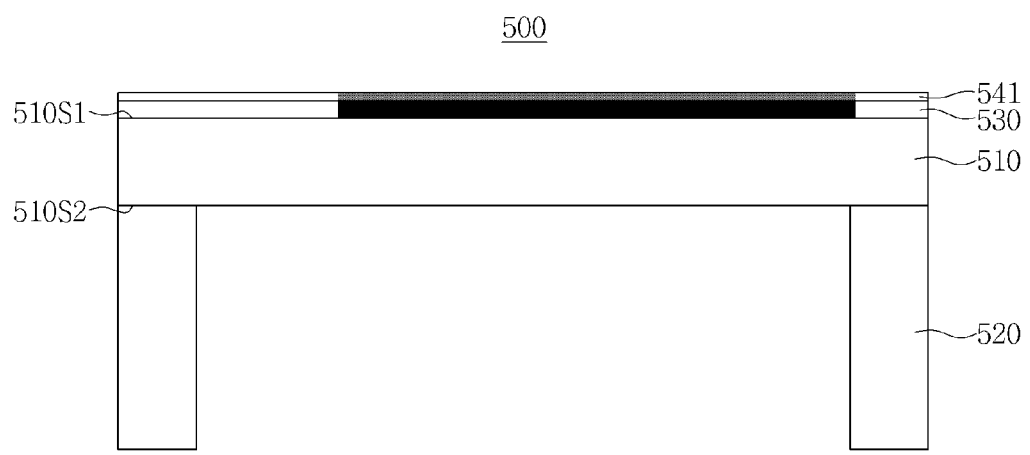

In the pellicle 500 according to some example embodiments of the inventive concepts, the first capping layer 541 is disposed on the first thermal buffer layer 531, and the second capping layer 542 is disposed on the second thermal buffer layer 532. However, in the pellicle 500 according to some example embodiments of the inventive concepts, surfaces of the first thermal buffer layer 531 and the second thermal buffer layer 532 may be exposed to an external environment as shown in FIGS. 9 and 10. In some example embodiments, the first thermal buffer layer 531 and the second thermal buffer layer 532 may include a material which prevents damage caused by a lithography process or cleaning process. For example, the first thermal buffer layer 531 and the second thermal buffer layer 532 may include a hydrogen resistant material.

In the pellicle 500 according to some example embodiments of the inventive concepts, the first surface 510S1 and the second surface 510S2 of the membrane 510 may be covered by the thermal buffer layer 530, the first capping layer 541, and the second capping layer 542. However, in the pellicle 500 according to some example embodiments of the inventive concepts, the first surface 510S1 or the second surface 510S2 of the membrane 510 may be exposed to an external environment as shown in FIGS. 11 to 14. In some example embodiments, the membrane 510 may include a material which prevents the damage caused by a lithography process or cleaning process. For example, the membrane 510 may include a hydrogen resistant material.

Figure 15:
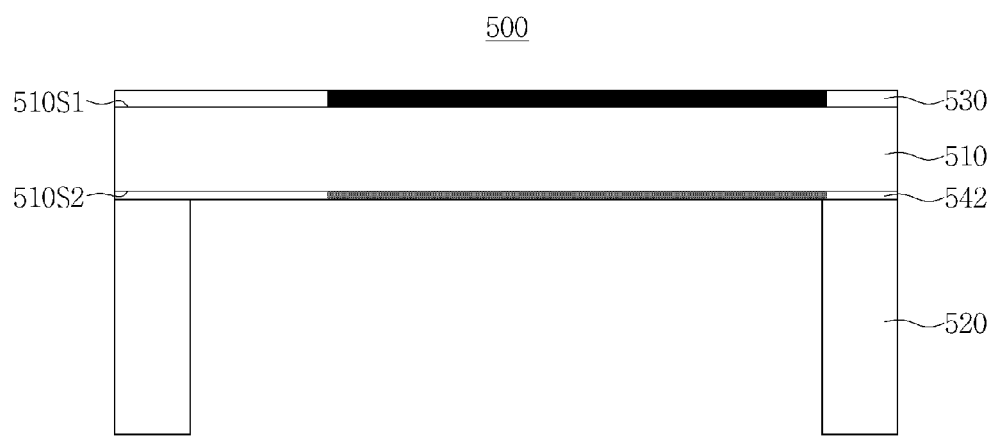
Figure 16:
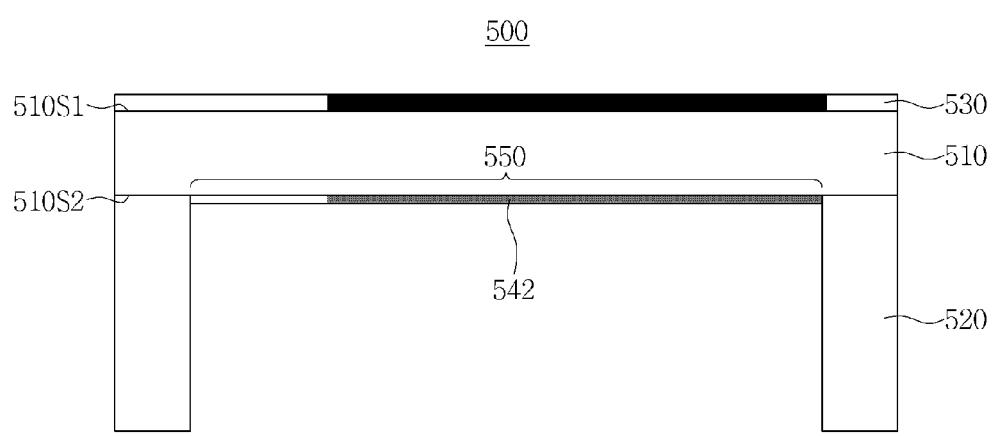

Further, in the pellicle 500 according to some example embodiments of the inventive concepts, a surface of the thermal buffer layer 530 disposed on the first surface 510S1 of the membrane 510 may be exposed to an external environment, and the second surface 510S2 of the membrane 510 may be covered by the second capping layer 542 as shown in FIGS. 15 and 16.

Figure 17:
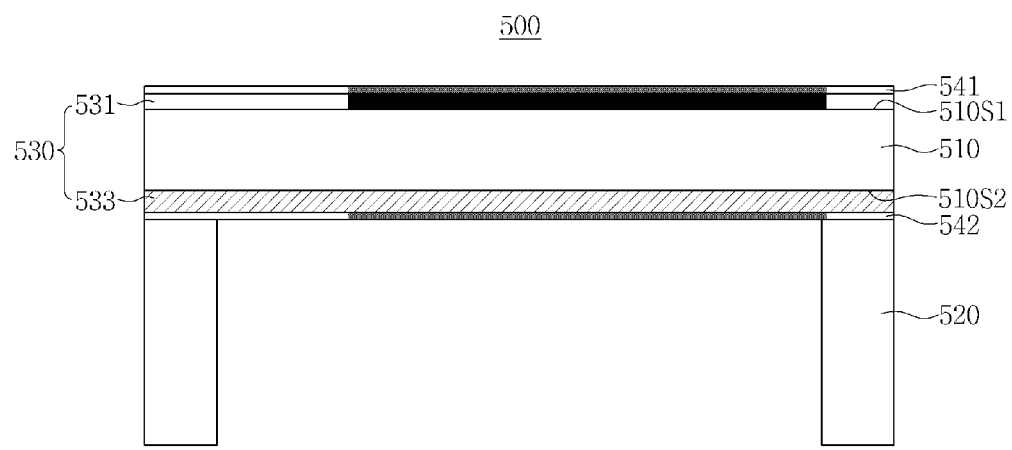

FIG. 17 is a view illustrating a pellicle according to some example embodiments of the inventive concepts.

Referring to FIG. 17, a pellicle 500 according to some example embodiments of the inventive concepts may include a membrane 510, a frame 520, a thermal buffer layer 530, a first capping layer 541, and a second capping layer 542.

The thermal buffer layer 530 may include a first thermal buffer layer 531 and a second thermal buffer layer 533. The first thermal buffer layer may be interposed between a first surface 510S1 of the membrane 510 and the first capping layer 541. The second thermal buffer layer may be interposed between a second surface 510S2 of the membrane 510 and the second capping layer 542.

The emissivity of the second thermal buffer layer 533 may be different than the emissivity of the first thermal buffer layer 531. A difference between the emissivity of the first thermal buffer layer 531 and the emissivity of the second thermal buffer layer 533 may be based on direction of light incident on each of the layers, where the light includes light used in a lithography process. For example, the emissivity of the first thermal buffer layer 531 may be higher than that of the second thermal buffer layer 533, based on a direction of light incident on the first thermal buffer layer 531.

The second thermal buffer layer 533 may include a different material from one or more materials included in first thermal buffer layer 531. A vertical thickness of the second thermal buffer layer 533 may be different than a vertical thickness of the first thermal buffer layer 531. For example, the vertical thickness of the second thermal buffer layer 533 may be greater than the vertical thickness of the first thermal buffer layer 531.

Figure 18:
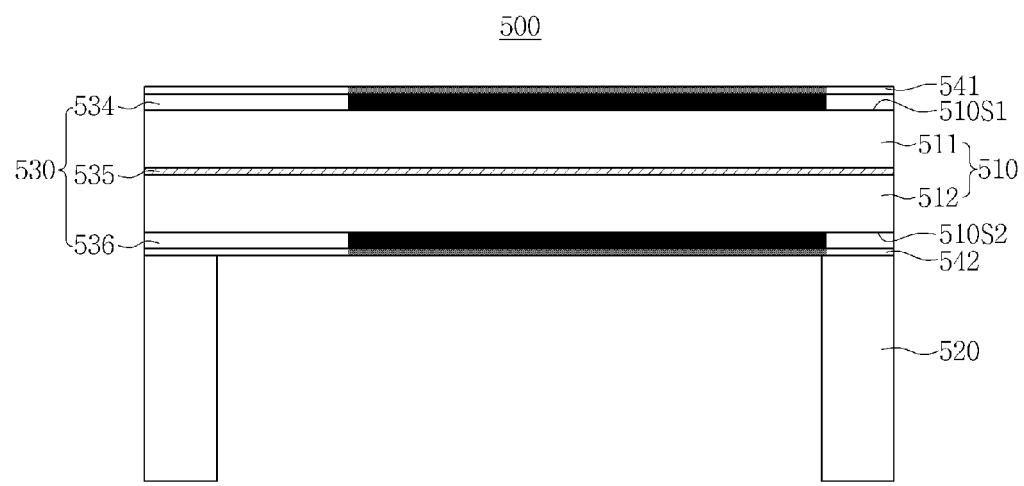

FIG. 18 is a view illustrating a pellicle according to some example embodiments of the inventive concepts.

Referring to FIG. 18, a pellicle 500 according to some example embodiments of the inventive concepts may include a membrane 510 having a first membrane 511 and a second membrane 512, a frame 520 disposed on a surface 510S2 of the second membrane 512, a thermal buffer layer 530 having a first outer thermal buffer layer 534, an inner thermal buffer layer 535, and a second outer thermal buffer layer 536, a first capping layer 541 disposed on the first outer thermal buffer layer 534, and a second capping layer 542 disposed on the second outer thermal buffer layer 536.

The first outer thermal buffer layer 534 may be disposed on a surface 510S1 of the first membrane 511. The second outer thermal buffer layer 536 may be disposed on the surface 510S2 of the second membrane 512. The emissivity of the second outer thermal buffer layer 536 may be the same as the emissivity of the first outer thermal buffer layer 534. The second outer thermal buffer layer 536 may include a material that is common with a material included in the first outer thermal buffer layer 534. A vertical thickness of the second outer thermal buffer layer 536 may be the same as the vertical thickness of the first outer thermal buffer layer 534.

The inner thermal buffer layer 535 may be interposed between the first membrane 511 and the second membrane 512. Sides of the inner thermal buffer layer 535 may be vertically arranged with sides of the first membrane 511 and the second membrane 512. A space between the first membrane 511 and the second membrane 512 may be fully filled with the inner thermal buffer layer 535.

A vertical thickness of the inner thermal buffer layer 535 may be different than a vertical thickness of one or more of the first outer thermal buffer layer 534 and the second outer thermal buffer layer 536. For example, the vertical thickness of the inner thermal buffer layer 535 may be lower than a vertical thickness of one or more of the first outer thermal butler layer 534 and the second outer thermal buffer layer 536. For example, the inner thermal buffer layer 535 may include a different material from the first outer thermal buffer layer 534 and the second outer thermal buffer layer 536. The emissivity of the inner thermal buffer layer 535 may be different than an emissivity of one or more of the first outer thermal buffer layer 534 and the second outer thermal butler layer 536.

Figure 19A:
FIGS. 19A 19B, and 19C are views sequentially illustrating a method of forming the pellicle according to some example embodiments of the inventive concepts.
Figure 19B:
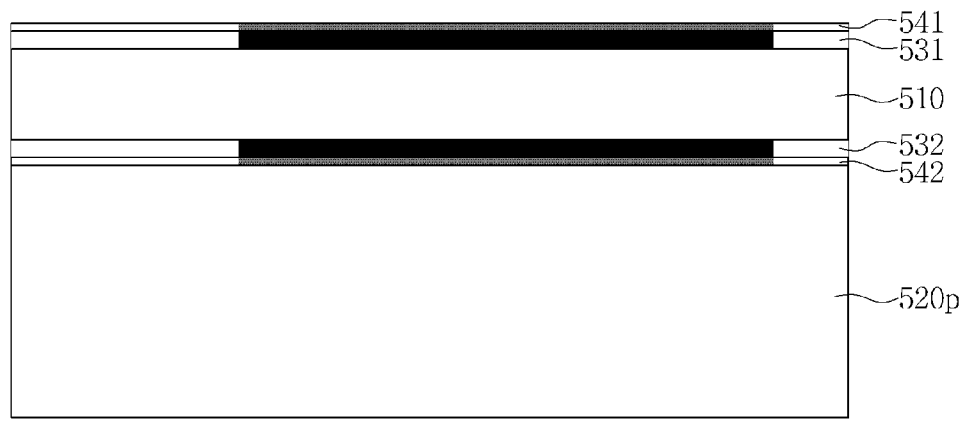
Figure 19C:
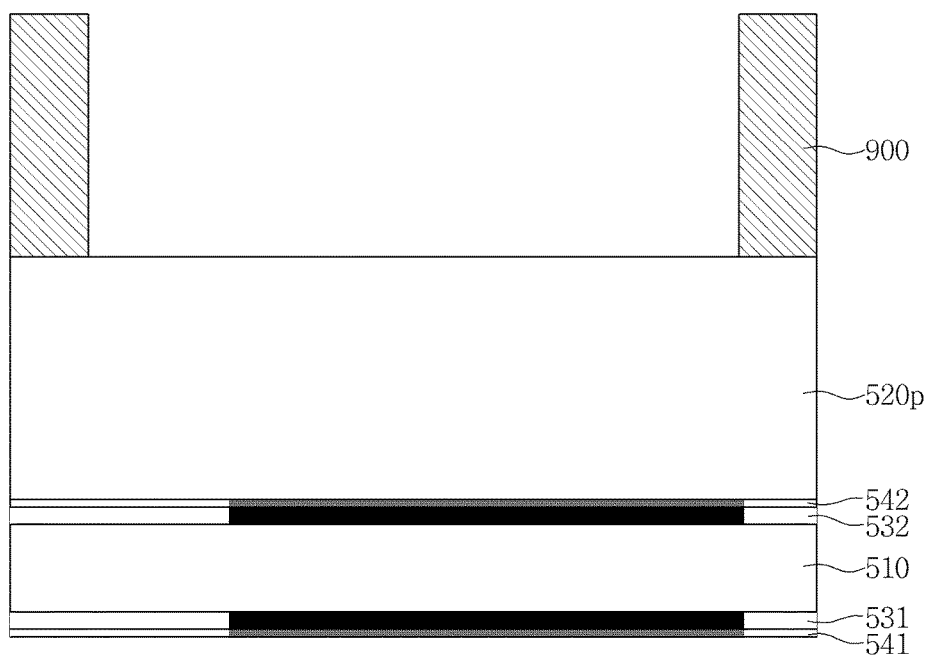

FIGS. 19A to 19C are views sequentially illustrating a method of forming the pellicle according to some example embodiments of the inventive concepts.

Referring to FIGS. 1B and 19A to 19C, the method of forming the pellicle according to some example embodiments of the inventive concepts will be described. First, referring to FIG. 19A, the method of forming the pellicle according to some example embodiments of the inventive concepts may include a process of forming a second capping layer 542 and a second thermal butler layer 532 on a frame substrate 520p.

The process of forming the second capping layer 542 and the second thermal buffer layer 532 on the frame substrate 520p may include a process of preparing the frame substrate 520p, a process of forming the second capping layer 542 on the frame substrate 520p, and a process of forming the second thermal buffer layer 532 on the second capping layer 542.

The process of forming the second thermal buffer layer 532 may include one or more of a chemical vapor deposition (CVD) process, a physical vapor deposition (PVD) process, an atomic layer deposition (ALD) process, a plasma deposition process, a wet/dry transfer process, an electro-spinning process, a filtration process, a vapor filtration process, or a screening process.

The process of forming the second capping layer 542 may be the same as the process of forming the second thermal buffer layer 532.

Referring to FIG. 19B, the method of forming the pellicle according to some example embodiments of the inventive concepts may include a process of forming a membrane 510, a first thermal buffer layer 531, and a first capping layer 541 on the second thermal buffer layer 532.

The process of forming the membrane 510, the first thermal buffer layer 531, and the first capping layer 541 may include a process of forming the membrane 510 on the second thermal buffer layer 532, a process of forming the first thermal buffer layer 531 on the membrane 510, and a process of forming the first capping layer 541 on the first thermal buffer layer 531.

The process of forming the first thermal buffer layer 531 may be the same as the process of forming the second thermal buffer layer 532. The process of forming the first capping layer 541 may be the same as the process of forming the second capping layer 542.

Referring to FIG. 19C, the process of forming the pellicle according to some example embodiments of the inventive concepts may include a process of forming a mask pattern 900 on the frame substrate 520p.

The mask pattern 900 may vertically overlap an edge area of the membrane 510. The frame substrate 520p vertically overlapping the center area of the membrane 510 may be exposed b the mask pattern 900. For example, the mask pattern 900 may include a photoresist pattern. The process of forming the mask pattern 900 may be the same as the process of forming the second thermal buffer layer 532.

Referring to FIG. 1B, the method of forming the pellicle according to some example embodiments of the inventive concepts may include a process of forming the frame 520 on the second capping layer 542.

The process of forming the frame 520 may include a process of etching the frame substrate 520p using the mask pattern 900 as an etching mask and a process of removing the mask pattern 900. The process of etching the frame substrate 520p may include a dry or wet etching process.

Figure 20A:
FIGS. 20A, 20B, and 20C are views sequentially illustrating a method of forming the pellicle according to some example embodiments of the inventive concepts.
Figure 20B:
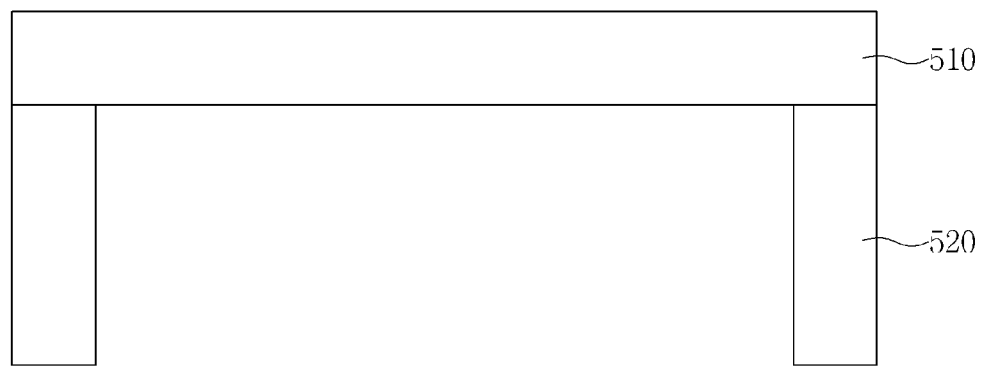
Figure 20C:
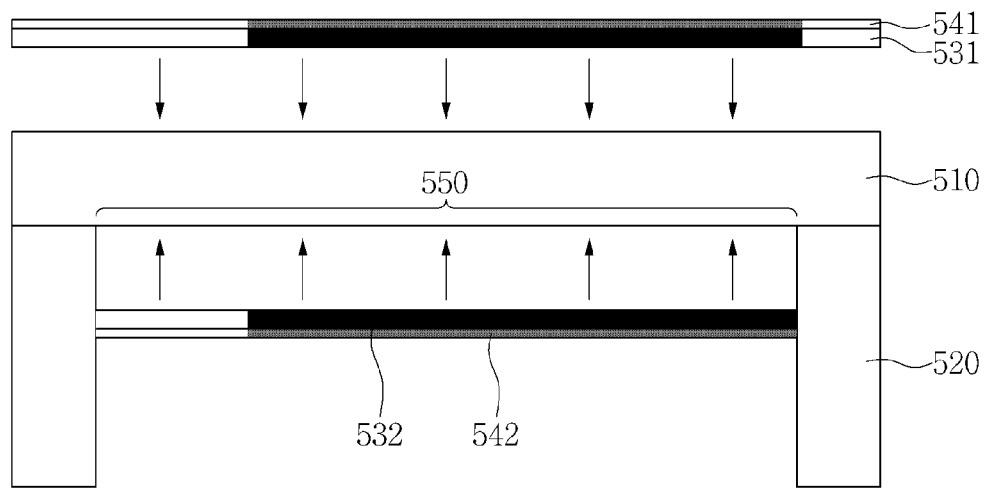

FIGS. 20A to 20C are views sequentially illustrating a method of forming the pellicle according to some example embodiments of the inventive concepts.

Referring to FIGS. 5 and 20A to 20C, the method of forming the pellicle according to some example embodiments of the inventive concepts will be described. First, referring to FIG. 20A, the method of forming the pellicle according to some example embodiments of the inventive concepts may include a process of forming a membrane 510 on a surface of a frame substrate 520p.

Referring to FIG. 20B, the method of forming the pellicle according to some example embodiments of the inventive concepts may include a process of forming a frame 520 on the membrane 510.

The process of forming the frame 520 may include a process of etching the frame substrate 520p.

Referring to FIGS, 5 and 20C, the method of forming the pellicle according to some example embodiments of the inventive concepts may include a process of forming a first thermal buffer layer 531, a second thermal buffer layer 532, a first capping layer 541, and a second capping layer 542 on surfaces 510S1 and 510S2 of the membrane 510. As shown in FIGS. 5 and 20C, the second thermal buffer layer 532 and the second capping layer 542 may be formed on the inner portion 550 of the second surface 510S2 of the membrane 510.

The process of forming the first thermal buffer layer 531, the second thermal buffer layer 532, the first capping layer 541, and the second capping layer 542 may include a process of forming the first thermal buffer layer 531 and the first capping layer 541 on the first surface 510S1 of the membrane 510, and a process of forming the second thermal buffer layer 532 and second capping layer 542 on the second surface 510S2 of the membrane 510.

The process of forming the first thermal buffer layer 531 and the first capping layer 541 may include a process of forming the first capping layer 541 on the first thermal buffer layer 531 and a process of physically attaching the first thermal buffer layer 531, on which the first capping layer 541 is formed, onto the first surface 510S1 of the membrane 510.

The process of forming the second thermal buffer layer 532 and the second capping layer 542 may include a process of forming the second capping layer 542 on the second thermal buffer layer 532 and a process of physically attaching the second thermal buffer layer 532, on which the second capping layer 542 is formed, onto the second surface 510S2 of the membrane 510 exposed b the frame 520.

Figure 21:
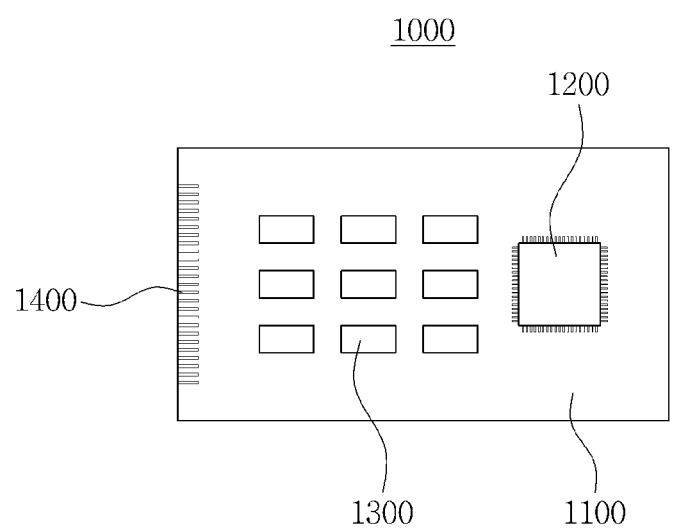
FIG. 21 is a view illustrating a semiconductor module including a semiconductor device formed by an EUV lithography apparatus having the pellicle according to some example embodiments of the inventive concepts.

FIG. 21 is a view illustrating a semiconductor module including a semiconductor device according to some example embodiments of the inventive concepts.

Referring to FIG. 21, the semiconductor module 1000 may include a module substrate 1100, a microprocessor 1200, memories 1300, and input/output terminals 1400. The microprocessor 1200, the memories 1300, and the input/output terminals 1400 may be mounted on the module substrate 1100. The semiconductor module 1000 may include a memory card or card package.

The microprocessor 1200 and the memories 1300 may include a semiconductor device formed by an lithography apparatus including the pellicle according to the various embodiments of the inventive concept. Accordingly, in the semiconductor module 1000 according to some example embodiments of the inventive concepts, the reliability and electrical characteristics of the microprocessor 1200 and the memories 1300 may be improved.

Figure 22:
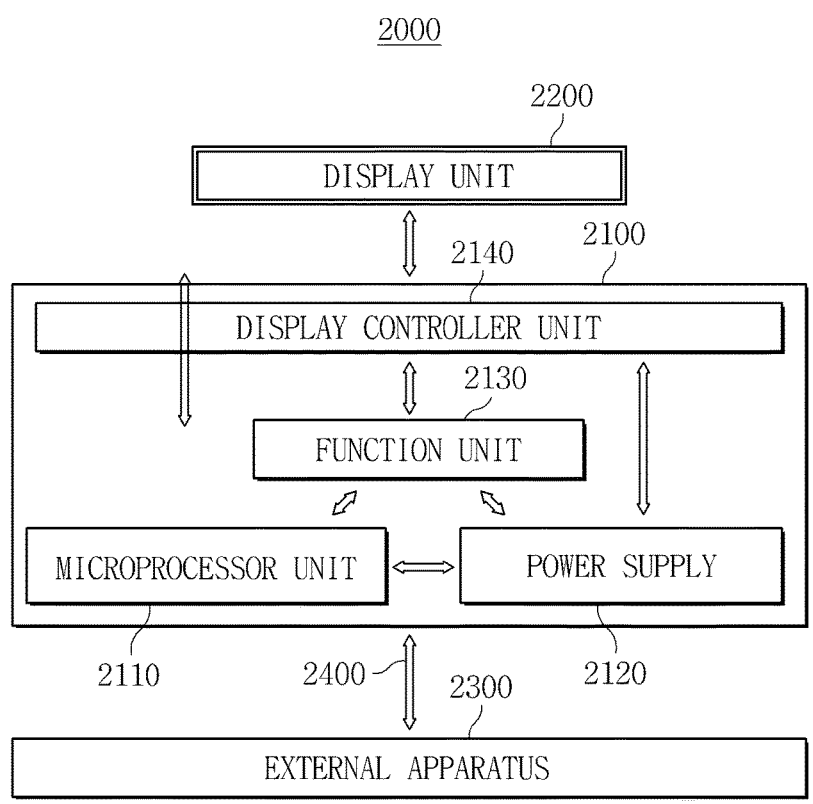
FIG. 22 is a view illustrating a mobile system including the semiconductor device formed by the EUV lithography apparatus having the pellicle according to some example embodiments of the inventive concepts.

FIG. 22 is a view illustrating a mobile system including the semiconductor device according to some example embodiments of the inventive concepts.

Referring to FIG. 22, a mobile system 2000 may include a body unit 2100, a display unit 2200, and an external apparatus 2300. The body unit 2100 may include a microprocessor unit 2110, a power supply 2120, a function unit 2130, and a display controller unit 2140.

The body unit 2100 may be a system board or motherboard including a printed circuit board (PCB). The microprocessor unit 2110, the power supply 2120, the function unit 2130, and the display controller unit 2140 may be installed or mounted on the body unit 2100.

The microprocessor unit 2110 may receive a voltage from the power supply 2120 to control the function unit 2130 and the display controller unit 2140. The power supply 2120 may receive a constant voltage from an external power source or the like, and divide the constant voltage into various voltage levels to supply to the microprocessor unit 2110, the function nit 130, the display controller unit 2140, etc.

The power supply 2120 may include a power management IC (PMIC). The PMIC may efficiently supply a voltage to the microprocessor unit 2110, the function unit 2130, the display controller unit 2140, etc.

The function unit 2130 may perform various functions of the mobile system 2000. For example, the function unit 2130 may include various components capable of performing wireless communication functions, such as outputting an image to the display unit 2200, outputting a voice to a speaker, using dialing or communication with the external apparatus 2300. For example, the function unit 2130 may serve as a camera image processor.

When the mobile system 2000 is connected to a memory card or the like to expand capacity hereof the function unit 2130 may serve as a memory card controller. When the mobile system 2000 further includes a Universal Serial Bus (USB) to expand functions thereof, the function unit 2130 may serve as an interface controller.

The display unit 2200 may be electrically connected to the body unit 2100. For example, the display unit 2200 may be electrically connected to the display controller unit 2140 of the body unit 2100. The display unit 00 may display an image processed by the display controller unit 2140 of the body unit 2100.

The microprocessor unit 2110 and the function unit 2130 of the body unit 2100 may include a semiconductor device formed by an EUV lithography apparatus including the pellicle according to the various embodiments of the present invention, Accordingly, the reliability and electrical characteristics of the mobile system 2000 according to some example embodiments of the inventive concepts can be improved.

Figure 23:
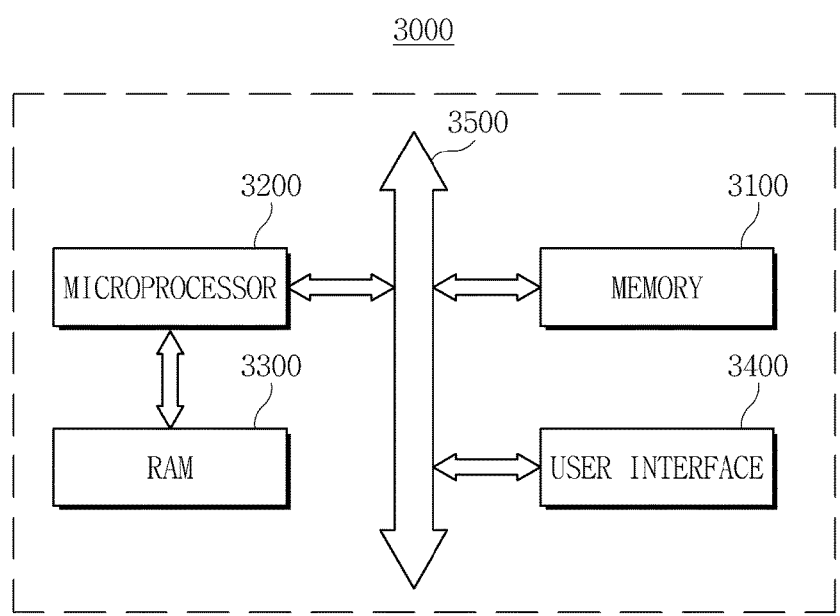
FIG. 23 is a view illustrating an electronic system including the semiconductor device formed by the EUV lithography apparatus having the pellicle according to some example embodiments of the inventive concepts.

FIG. 23 is a view illustrating an electronic system including the semiconductor device according to some example embodiments of the inventive concepts.

Referring to FIG. 23, an electronic system 3000 may include a memory 3100, a microprocessor 3200, a random access memory (RAM) 3300, and a user interface 3400. The electronic system 3000 may be a system such as an LED lighting device, a refrigerator, an air conditioner, an industrial cutting machine, a welding machine, a vehicle, a vessel, an airplane, a satellite, etc.

The memory 3100 may store booting codes of the microprocessor 3200, data processed by the microprocessor 3200, or external input data. The memory 3100 may include a controller.

The microprocessor 3200 may program and control the electronic system 3000. The RAM 3300 may be used for an operational memory of the microprocessor 3200.

The user interface 3400 may perform data communication using a bus 3500. The user interface 3400 may be used for data input to the elect system 3000 or data output from the electronic system 3000.

The memory 3100, the microprocessor 3200, and the RAM 3300 may include a semiconductor device formed by an EUV lithography apparatus including the pellicle according to the various embodiments of the inventive concept. Accordingly, the reliability and electrical characteristics of the electronic system 3000 according to some example embodiment of the inventive concepts can be improved.

The pellicle and the EUV lithography apparatus including the pellicle according to some example embodiments of the inventive concepts can prevent heat generated by light having high energy used in a lithography process from accumulating in a membrane. The light used in a lithography process may include extreme ultraviolet light. Accordingly, the pellicle and the EUV lithography apparatus including the pellicle according to some example embodiments of the inventive concepts can prevent deformation of the membrane caused by the thermal accumulation. Thus, in the pellicle and the EUV lithography apparatus including the pellicle according to some example embodiments of the inventive concepts, the durability and lifetime of the pellicle can be improved. In addition, in the pellicle and the EUV lithography apparatus including the pellicle according to some example embodiments of the inventive concepts, the reliability of a process can be improved.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A pellicle comprising:
a membrane configured to be on an optical pattern of a reticle; and
a first thermal buffer layer on a first surface of the membrane, the first thermal buffer layer being associated with a first emissivity, the first emissivity being greater than an emissivity of the membrane,
wherein the pellicle is configured to be on the reticle during EUV lithography, such that EUV light passes through the first thermal buffer layer and the membrane to be reflected from the optical pattern in the reticle, heat is generated at the membrane based on the EUV light passing through the membrane, and the first thermal buffer layer discharges the heat generated at the membrane to an external environment based on the first thermal buffer layer being associated with the first emissivity that is greater than the emissivity of the membrane.

2. The pellicle of claim 1, wherein the first thermal buffer layer includes carbon.

3. The pellicle of claim 2, wherein the first thermal buffer layer includes at least one of amorphous carbon, graphene, nanographite, a carbon nanosheet, a carbon nanotube, silicon carbide (SiC), and boron carbide (BC).

4. The pellicle of claim 1, wherein a vertical thickness of the first thermal buffer layer is lower than a vertical thickness of the membrane.

5. The pellicle of claim 1, further comprising:
a second thermal buffer layer on a second surface of the membrane, the second surface being an opposite surface of the membrane relative to the first surface of the membrane, the second thermal buffer layer associated with a second emissivity, the second emissivity being greater than the emissivity of the membrane.

6. The pellicle of claim 5, wherein the second thermal buffer layer includes carbon.

7. The pellicle of claim 5, wherein the second emissivity is equal to the first emissivity.

8. The pellicle of claim 5, further comprising:
a frame on the second surface of the membrane; and
a capping layer on the second surface of the membrane,
wherein the frame includes an inner side and an outer side, the inner side at least partially bounding an inner portion of the second surface of the membrane, the outer side facing the external environment, the capping layer on the inner portion of the second surface.

9. A pellicle comprising:
a membrane;
a first capping layer; and
a first thermal buffer layer between a first surface of the membrane and the first capping layer, the first thermal buffer layer including a first carbon content, the first carbon content being greater than each of a carbon content of the membrane and a carbon content of the first capping layer.

10. The pellicle of claim 9, wherein a vertical thickness of the first capping layer is lower than a vertical thickness of the first thermal buffer layer.

11. The pellicle of claim 9, further comprising:
a second capping layer on a second surface of the membrane, the second surface being an opposite surface of the membrane relative to the first surface of the membrane, the first carbon content being greater than a carbon content of the second capping layer.

12. The pellicle of claim 11, further comprising:
a frame on the second surface of the membrane, the frame including an inner side and an outer side, the inner side at least partially bounding an inner portion of the second surface of the membrane, the outer side facing an external environment, the second capping layer is on the inner portion of the second surface.

13. The pellicle of claim 11, further comprising:
a second thermal buffer layer between the membrane and the second capping layer, the second thermal buffer layer including a second carbon content, the second carbon content being greater than the carbon content of each of the membrane and the second capping layer.

14. The pellicle of claim 13, wherein the second carbon content equals the first carbon content.

15. The pellicle of claim 9, wherein the first capping layer includes a hydrogen resistant material.

16. A pellicle comprising:
a membrane configured to be on an optical pattern of a reticle; and
a thermal buffer layer on a surface of the membrane, the thermal buffer layer configured to emit thermal radiation, the thermal radiation emitted by the thermal buffer layer associated with an intensity exceeding an intensity of thermal radiation emitted by the membrane,
wherein the pellicle is configured to be on the reticle during EUV lithography, such that EUV light passes through the thermal buffer layer and the membrane to be reflected from the optical pattern in the reticle, heat is generated at the membrane based on the EUV light passing through the membrane, and the thermal buffer layer discharges the heat generated at the membrane to an external environment based on the thermal buffer layer being emitting thermal radiation associated with the intensity exceeding the intensity of thermal radiation emitted by the membrane.

17. The pellicle of claim 16, further comprising a capping layer on a surface of the thermal buffer layer, the capping layer including a lower amount of carbon than an amount of carbon included in the thermal buffer layer.

18. The pellicle of claim 16, further comprising a frame on the surface of the membrane, the frame including an inner side and an outer side, the inner side at least partially bounding an inner portion of the surface of the membrane, the outer side facing the external environment, wherein the thermal buffer layer is on the inner portion of the surface.

19. The pellicle of claim 16, wherein the thermal buffer layer includes:
a first thermal buffer layer on a first surface of the membrane; and
a second thermal buffer layer on a second surface of the membrane, the second surface being an opposite surface of the membrane relative to the first surface of the membrane, the first and second thermal buffer layers configured to emit different intensities of thermal radiation.

20. The pellicle of claim 19, wherein a vertical thickness of the second thermal buffer layer is different than a vertical thickness of the first thermal buffer layer.

* * * * *